United States Patent [19]

Upadhyayula

[11] 4,145,624
[45] Mar. 20, 1979

[54] FET-TELD COMBINATION WITH CAPACITIVELY COUPLED OUTPUT ELECTRODE MEANS

[75] Inventor: Lakshminarasimha C. Upadhyayula, East Windsor, N.J.

[73] Assignee: RCA Corporation, New York, N.Y.

[21] Appl. No.: 816,692

[22] Filed: Jul. 18, 1977

[51] Int. Cl.² .................. H01L 27/26; H03K 19/40; H03K 19/08
[52] U.S. Cl. .................. 307/299 R; 307/205; 307/214
[58] Field of Search .................. 307/214, 299 R, 205; 357/3

[56] References Cited

U.S. PATENT DOCUMENTS

| 3,115,584 | 12/1963 | Yao | 307/214 X |
| 3,848,141 | 11/1974 | Sterzer | 307/299 R |
| 3,980,896 | 9/1976 | Kato | 307/214 X |
| 4,000,415 | 12/1976 | Curtice | 307/299 R |

OTHER PUBLICATIONS

IEEE Journal of Solid State Electronics, vol. SC-7, No. 3, Jun. 1972, pp. 231-237, "A Most Inverter with Improved Switching Speed", by J. Kooman & Akker.
IEEE Journal of Solid State Circuits – "Gunn Device Gigabit Rate Digital Microcircuits" by K. Mause, A. Schlachetzki, E. Hesse and H. Salow; pp. 2-11, Feb. 1975.
Electronic Letters, "Integration of GaAs MESFETS and Gunn Elements in a 4-Bit Gate Device" by N. Hashizume and S. Kataoka; pp. 370-372, Jul. 1976, vol. 12, No. 15.

Primary Examiner—John S. Heyman
Attorney, Agent, or Firm—H. Christoffersen; Robert Rodrick; Joseph D. Lazar

[57] ABSTRACT

A field effect transistor (FET) is connected in series to a transferred electron logic device (TELD), the TELD being a non-linear load resistor for the FET. The current thresholding property of the TELD and the saturation characteristics of the FET are utilized to produce an output pulsed signal of substantial voltage gain with fast rise time and short pulse width. An output electrode is capacitively coupled to the TELD to provide an output pulsed signal of alternating polarity for direct interconnection of devices in cascaded circuits.

5 Claims, 2 Drawing Figures

FET-TELD COMBINATION WITH CAPACITIVELY COUPLED OUTPUT ELECTRODE MEANS

The Government has rights in this invention pursuant to Contract Nos. N00014-76-C-0464 and N00014-76-C-0100 awarded by the Department of the Navy.

BACKGROUND OF THE INVENTION

1. Field of the Invention

This invention relates to a combination of a field effect transistor (FET) serially connected to a transferred electron logic device (TELD) including an output electrode capacitively coupled to the TELD for transmission of an output pulsed signal of predetermined voltage gain and alternating polarity for use in directly interconnected cascaded circuits for high speed logic applications.

2. Description of the Prior Art

In signal and data processing applications at gigabit rates it is desirable to utilize devices which offer fast switching speeds, typically of the order of 20 to 50 pico-seconds, and output signals of substantial gain while providing "fan-out." "Fan-out" as the term is commonly used in logic applications, refers to the number of similar circuits or gates a device is capable of driving. In many applications it is also desirable to cascade the devices to meet various circuit requirements. In the cascaded arrangement, the output of the first device must be capable of triggering the following device. If the output of a logic device is of the same polarity as the input of the device to which it is connected, triggering can be effected without additional invertors after each stage facilitating small or medium scale integration.

Logic gates formed of gallium arsenide (GaAs) field effect transistors (FET) operating in the depletion mode or from GaAs transferred electron logic devices (TELD) can handle data rates that are substantially higher than the highest rates that appear possible with logic gates made from silicon. Transferred electron logic devices, also referred to as Gunn devices, have desirable threshold properties which are utilized to achieve pulse rise and delay times less than 50 pico-seconds. TELD logic gates can also be directly interconnected without invertors or level shifters. However, the TELD logic gate has poor input sensitivity and it is technologically difficult to obtain high stable gain. The input sensitivity, as is known in this art, is the minimum voltage signal required to trigger the TELD into the threshold mode of operation causing near transit time oscillations and the formation of domains in the device. On the other hand, the FET has good sensitivity and high gain, but such devices cannot be directly interconnected because the required dc input and available dc output levels are different. Also, the minimum pulse width that can be processed through FET circuits is disadvantageously of the order of 400 pico-seconds. (See *Gunn Effect Logic Devices*, by Hans L. Hartnagel, published by American Elsevier Co., Inc., N.Y., N.Y., 1973, page 111).

A combination of an FET and a TELD to utilize the advantageous characteristics of each device has been suggested. K. Mause, A. Schlachetzki, E. Hesse and H. Salow, in their paper, "Gunn Device Gigabit Rate Digital Microcircuits," IEEE Journal of Solid State Circuits, pages 2–11, February 1975, show an FET used as a load with a TELD. The combination is arranged in a common drain configuration with the TELD incorporated in the source side of the FET. In such a combination, the generated output pulse is of the same polarity as the input which is desirable for cascading, but the voltage gain is on the order of only 0.5. For gigabit rate applications it is desirable that logic circuits have a gain typically greater than 1.0. Arranging the combination of Mause et al. such that the TELD is incorporated in the drain side of the FET would produce an output of advantageously higher gain, but the output signal would have a polarity opposite to that of the input signal, necessitating invertors and level shifters for cascading. An FET-TELD combination is also shown in a paper by N. Hashizume and S. Kataoka, "Integration of GaAs MESFETs and Gunn Elements in a 4-Bit Gate Device," Electronic Letters, Vol. 12, No. 15, pages 370–372, July 22, 1976. The arrangement of Hashizume and Kataoka is with the input signal to the TELD. The amplitudes of the signal levels are so high that they do not appear to be compatible with high-speed logic circuits.

SUMMARY OF THE INVENTION

According to the present invention, a field effect type transistor is serially connected to a transferred electron type device. The transistor has drain, gate and source electrodes and is characterized by an ohmic region of operation in which the drain current varies with voltage and a constant-current region of operation in which the drain current is substantially constant with voltage. The transferred electron type device is characterized by a transfer of electrons from a high to a low mobility subband and the formation of domains upon the application of an electric field above a threshold value. The device has a peak current at the threshold voltage and a lower current above the threshold voltage, the lower current being substantially constant with increasing voltage.

The transistor is biased to operate in the constant-current region such that the drain current is below the peak current and above the lower current of the device. Included is means for applying an input signal of a given polarity to the gate electrode of the transistor to increase the drain current to a level equal to or greater than the threshold current. At or above the threshold current domains are formed in the device and the drain current decreases to the lower current level producing a shift in the operation of the transistor to the ohmic region and an output pulsed signal of predetermined voltage gain. Electrode means is capacitively coupled to the device for transmission of the output pulsed signal, the capacitive coupling of the electrode means producing an alternating positive and negative polarity in the output pulsed signal.

DETAILED DESCRIPTION OF THE PREFERRED EMBODIMENT

Figure 1:
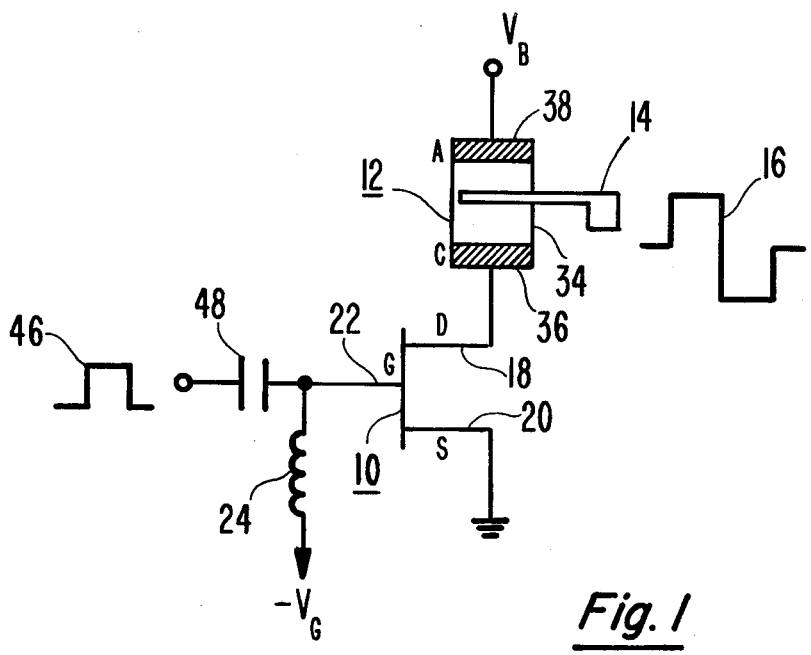
FIG. 1 is a schematic representation of the combination according to the present invention showing a field effect transistor (FET) serially connected to a transferred electron logic device (TELD).

Referring to the drawing, there is shown in FIG. 1 a combination of a field effect transistor (FET) 10 integrally connected in series to a transferred electron logic device (TELD) 12. According to the invention an electrode 14 is capacitively coupled to TELD 12 to transmit an output pulsed signal 16 of alternating polarity as will be described in detail. Such a combination may be used in gigabit rate logic circuits as a pulse amplifier or a regenerator.

In the preferred embodiment of the invention, FET 10 is a metal semiconductor field effect transistor (MESFET), although other field effect type transistors such as, for example, junction field effect transistors (JFET), wherein the current is controlled by an electric field, may be used. FET 10 has drain 18, source 20 and gate 22 electrodes. A reverse bias $-V_G$, applied to gate electrode 22 through, for example, an inductor 24, is used to control the current flow between the drain electrode 18 and the source electrode 20. Although field effect transistors may be operated in three modes — depletion only, enhancement only and a combination of enhancement and depletion, it is preferable that FET 10 be operated in the depletion only mode. The depletion type FET has considerable drain current flow for zero gate voltage. No forward gate voltage is utilized. Maximum drain current flows when the gate-source voltage $V_G$ is zero. Drain current is reduced by applying a reverse voltage $-V_G$ to gate electrode 22, that is, the drain current decreases as the gate voltage $-V_G$ becomes more negative.

Figure 2:
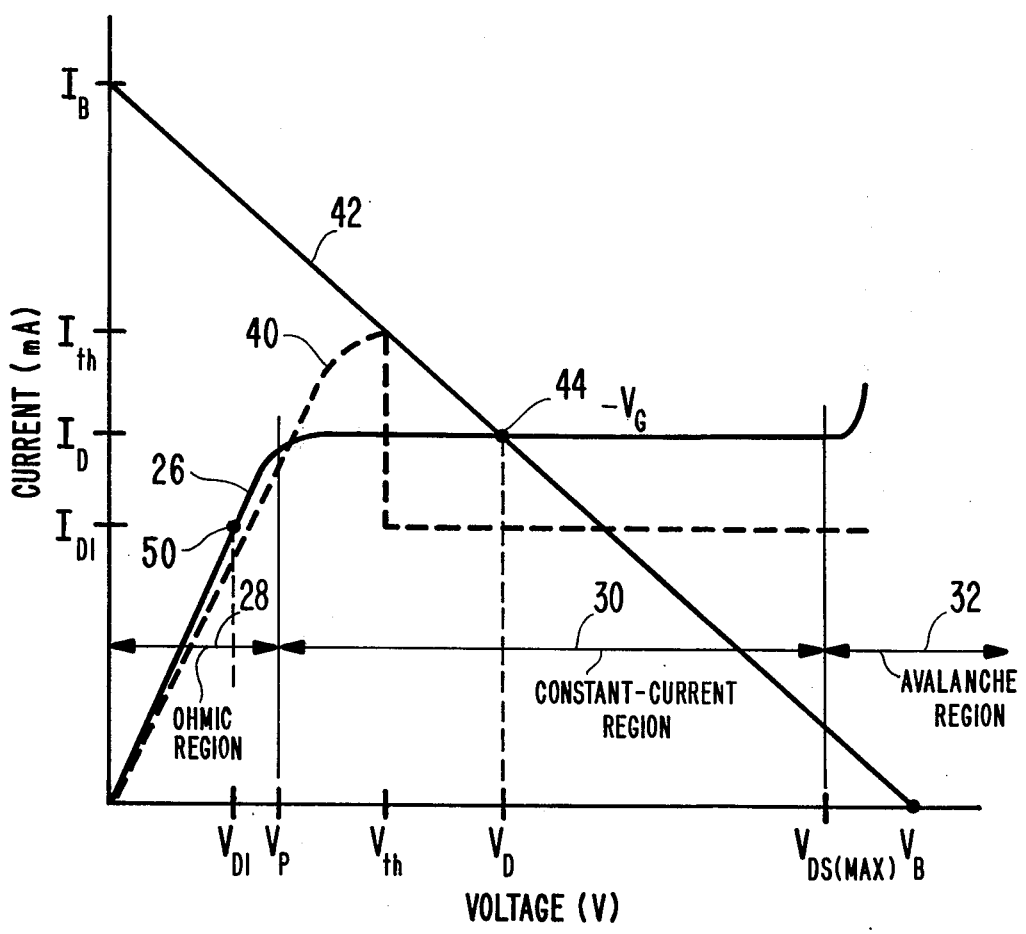
FIG. 2 is a graph showing the current-voltage characteristics of the FET-TELD combination of FIG. 1.

In FIG. 2, the current voltage characteristics of a depletion-type FET is shown by the solid curve 26. Below the pinch-off voltage $V_p$, FET 10 operates in the ohmic region 28. Above the pinch-off voltage $V_p$ up to the drain-source breakdown voltage $V_{DS}$ (max), FET 10 operates in the constant-current region 30. A third region 32, above the breakdown voltage, is the avalanche region where FET 10 is not operated. In the ohmic region 28, the I-V curve has the characteristic of a resistance. The shape of the curve in ohmic region 28 is a function of the drain-source voltage and the slope is governed by $V_G$. In the constant-current region 30, the drain current $I_D$ is saturated, that is, $I_D$ is held at a constant level for a given, fixed gate voltage $V_G$. A change in $V_G$ produces a change in $I_D$. Thus, in the constant-current region, FET 10 exhibits the transconductance characteristic that is essential to amplifier operation. The transconductance of a field effect transistor is defined as the relationship between an input signal voltage and an output signal current, with the drain-source voltage held constant.

TELD 12 has a non-linear resistance and is preferably of the planar type for integrated circuit purposes. TELD 12 comprises a body 34 of semiconductor material such as gallium arsenide (GaAs) and other III-V compounds or mixtures of such compounds. Semiconductor body 34 exhibits a differential negative resistance through the "transferred electron effect," an effect well known and exhibited in Gunn devices and the like. For further details on the transferred electron effect, see U.S. Pat. No. 3,991,328 issued Nov. 9, 1976, and U.S. Pat. No. 3,706,014 issued Dec. 12, 1972. A cathode terminal 36 and an anode terminal 38 are provided in a spaced relation on the semiconductor body 34 as shown in FIG. 1. Cathode terminal 36 of TELD 12 is connected to drain electrode 18 of FET 10 in the preferred embodiment of the invention to establish a series current through the devices. Source electrode 20 is grounded. Anode terminal 38 may also be connected to source electrode 20 in another embodiment of the invention with cathode terminal 36 grounded. A voltage $V_B$, the purpose of which will be described, is applied to anode terminal 38.

The I-V characteristic curve of TELD 12 is superimposed in FIG. 2 on the I-V curve of FET 10 and is indicated by the dashed curve 40. TELD 12 is a threshold device which is characterized by a transfer of electrons from a high to a low mobility sub-band and the formation of domains in the presence of a suitable biasing potential above the threshold value. At the threshold voltage, $V_{th}$, the current $I_{th}$ is at its peak. When TELD 12 is triggered by applying a voltage equal to or greater than $V_{th}$, domains are formed and the device current drops to a lower level, or, "valley current," $I_{D1}$. Above the threshold voltage, $I_{D1}$ is substantially constant with increasing voltage. In many TELD applications it is usual to bias the device slightly below threshold at a current typically about 0.90-0.95 times threshold. This current is commonly referred to as the stand-off or quiescent current level. When an input signal of sufficient magnitude is applied to the TELD to increase the value of the electric field above that of threshold, domains are formed and the device changes from a relatively high current state to a low current state. The threshold field of TELD 12 is the threshold voltage divided by the cathode electrode 36 to anode electrode 38 length.

In operation of the combination, FET 10 and TELD 12 are selected such that the drain current of FET 10 for zero gate-source voltage ($V_G=0$) is larger than the voltage $V_{th}$ at the peak (threshold) current $I_{th}$ for TELD 12. A load line 42 is chosen to have a slope approximately equal to the inverse of the low field resistance of TELD 12, line 42 being established by voltage $V_B$ at zero drain current and by current $I_B$ at zero operating voltage (FIG. 2). The operating voltage of the combination is also chosen so that when the circuit is activated, the voltage available for TELD 12 is equal to or greater than the threshold value. FET 10 is biased, as by negative voltage $-V_G$, to operate in the constant-current constant region 30. At this condition, the operating voltage of FET 10 is $V_D$ (FIG. 2) as established by the intersection 44 of the characteristic curve 26 of FET 10 and load line 42. The saturated operating current $I_D$ of FET 10 at this reverse biasing condition is below the peak current $I_{th}$ and above the valley current level $I_{D1}$ of TELD 12, current $I_D$ being at the quiescent current level for TELD 12.

As shown in FIG. 1, a positive input pulsed signal 46 is applied to gate terminal 22 of FET 10 by a source (not shown) through, for example, a capacitor 48. Application of pulsed signal 46 serves as a trigger input to the combination for generation of amplified output pulsed signal 16. Triggering of the combination may also be achieved by continuous wave input signals to gate terminal 22. Upon application of input pulsed signal 46, the drain current increases to a level equal to or greater than the peak current $I_{th}$ of TELD 12. The slope of the load line 42 is such that the voltage across TELD 12 increases above the threshold value. Under these threshold conditions high field domains form in TELD 12 and the current drops to level $I_{D1}$. Since current $I_{D1}$ is lower than the quiescent current $I_D$, the operating point of FET 10 shifts into the ohmic region 28 and the operating voltage changes from $V_D$ to $V_{D1}$ as shown by point 50 on curve 26 in FIG. 2. The change in drain voltage from $V_D$ to $V_{D1}$ produces an amplified pulsed output signal 16 of substantial voltage gain, fast rise time and short pulse width. In a particular circuit incorporating the preferred embodiment for example, a voltage gain of approximately 2 has been achieved with pulse widths as narrow as 100–150 pico-seconds, and switching speed on the order of 20–50 pico-seconds.

In many logic applications the devices within the circuit are cascaded as described in the prior art discussion above. In cascaded arrangements the output of a device must be capable of triggering the following circuit requiring the polarity of the output pulse to be the same as the polarity as the input trigger pulse of the following device. To provide for direct interconnection between devices without the utilization of invertors or level shifters, output electrode 14 is capacitively coupled to TELD 12 in accordance with the present invention. When the domain is formed in TELD 12 upon application of input signal 46, output signal 16 appears at electrode 14. The output is positive when the traveling domain is between the cathode terminal 36 and electrode 14 and negative when the domain is between electrode 14 and anode terminal 38. The output of the capacitively coupled electrode may be expressed as $$V_O = \alpha k V_{th} \tag{1}$$

where $V_O$ is the output voltage in volts, $\alpha$ is the coupling constant and k is equal to $\Delta I/I_{th}$ where $\Delta I$ is the change in drain current and $I_{th}$ is the threshold current of TELD 12. Because of the capacitive coupling of electrode 14 to TELD 12, there is no dc signal present in the output pulsed signal 16 and signal 16 has pulses of alternating positive and negative polarity. Either of the two polarities may be utilized allowing for direct cascading of logic devices.

What is claimed is:

1. In combination:
    a field effect type transistor having drain, gate and source electrodes, said transistor being characterized by an ohmic region of operation in which the drain current varies with voltage and a constant-current region of operation in which the drain current is substantially constant with voltage;
    a transferred electron type device connected to said transistor to form a series current therethrough, said device being characterized by a transfer of electrons from a high to a low mobility sub-band and the formation of domains upon the application of an electric field above a threshold value, said device having a peak current at the threshold voltage and a lower current above the threshold voltage, said lower current being substantially constant with increasing voltage;
    said transistor being biased to operate in said constant-current region such that said drain current is below said peak current and above said lower current of said device;
    means for applying an input signal of a given polarity to the gate electrode of said transistor to increase the drain current to a level equal to or greater than the threshold current of said device causing thereby the formation of domains in said device and a decrease in said drain current to the level of said lower current of said device and producing thereby a shift in the operation of said transistor to said ohmic region and an output pulsed signal of a predetermined voltage gain; and
    electrode means capacitively coupled to said device for transmission of said output pulsed signal, the capacitive coupling of said electrode means producing an alternating positive and negative polarity in said output pulsed signal.

2. The combination according to claim 1, wherein said field effect type transistor is a metal semiconductor field effect transistor (MESFET).

3. The combination according to claim 1, wherein said field effect type transistor is biased to operate in the depletion mode.

4. The combination according to claim 1, wherein said transferred electron type device comprises a body of semiconductor material and spaced anode and cathode terminals connected to said body, and wherein said cathode terminal is connected to said drain electrode of said transistor and said source electrode of said transistor is connected to ground.

5. The combination according to claim 4, wherein the semiconductor material of said body is gallium arsenide (GaAs).

* * * * *